United States Patent [19]

Merritt

[11] Patent Number: 5,444,408

[45] Date of Patent: Aug. 22, 1995

[54] ACTIVE PULL-UP VOLTAGE SPIKE REDUCER

[75] Inventor: Todd A. Merritt, Boise, Id.

[73] Assignee: Micron Technology, Inc., Boise, Id.

[21] Appl. No.: 167,262

[22] Filed: Dec. 13, 1993

[51] Int. Cl.$^6$ .......................... H03L 5/00; H03K 3/00; H03K 19/0175; G05F 1/10
[52] U.S. Cl. .................... 327/306; 327/108; 327/215; 327/535; 327/537; 326/62; 326/68; 326/81; 326/83
[58] Field of Search ................ 307/264, 270, 296.6, 307/296.8, 272.3, 475, 571; 328/168, 172; 327/306, 108, 199, 215, 291, 293, 294, 535, 537; 326/62, 63, 68, 80, 81, 82, 83

[56] References Cited

U.S. PATENT DOCUMENTS

| | | | |
|---|---|---|---|
| 5,136,190 | 8/1992 | Chern et al. | 307/264 |
| 5,266,848 | 11/1993 | Nakagome et al. | 307/264 |
| 5,280,198 | 1/1994 | Almulla | 307/296.6 |

Primary Examiner—Timothy P. Callahan
Assistant Examiner—Trong Phan
Attorney, Agent, or Firm—David J. Paul

[57] ABSTRACT

An embodiment of the present invention provides a method to reduce a regulated power source voltage spike during operation of a dynamic random access memory by the steps of: providing a voltage spike reducer enabling pulse via a pulse generator circuit responsive to a pulse generator input signal; translating the voltage level of an unregulated power source via a level translation stage during the presence of the voltage spike reducer enabling pulse; amplifying a translated voltage level; and providing a measure of current from the unregulated power supply to the regulated power supply via a current driver stage that is responsive to the amplified translated voltage level translation. The method is realize by in a CMOS active pull-up voltage spike reducing circuit for a semiconductor device comprising: first, second and third potentials for powering the active pull-up voltage spike reducing circuitry; a pulse generator stage responsive to a pulse generator input signal; a level translator stage responsive to an output pulse of the pulse generator circuit; a translated driver stage responsive to an output of the level translator stage; and a current driver stage responsive to said translated driver stage to thereby provide additional current to the third potential.

16 Claims, 2 Drawing Sheets

ACTIVE PULL-UP VOLTAGE SPIKE REDUCER

FIELD OF THE INVENTION

This invention relates to a CMOS voltage spike reducing circuit formed in a semiconductor integrated circuit (IC) and in particular a voltage spike reducing circuit that may be used in memory devices, such as dynamic random access memories (DRAMs).

BACKGROUND OF THE INVENTION

Many Integrated Circuits (ICs) are powered by an internal regulated voltage source which insures device protection from voltages that may exceed operating specifications if unregulated supplies were used. However, using a regulated supply has a major downfall. That downfall being that the current supplied by the regulated supply may be too limiting during critical operating cycles of a given IC.

For example, in a Dynamic Random Access Memory (DRAM), during active pull up time, a large current spike causes the internal regulated supply to take a sizable dip. This dip in voltage can slow down the operation of the DRAM (i.e. measurements of access time to column address ($t_{AA}$) have shown $t_{AA}$ to slow down by as much as 4 ns on 4 Mbit Drams).

Prior solutions include such ideas as, increasing the current capacity of the regulator or improving the regulator's frequency response both of which have disadvantages. A disadvantage of increasing the current capacity of the regulator is that it requires extra bias current to operate the IC as P-channel power amplifiers require a lot of extra current to turn them on. A disadvantage of improving the frequency response of the regulator is the circuit complexity required.

What is needed is a simple circuit, with no feedback or frequency response considerations to take into account, that will supply the needed current at the proper time.

SUMMARY OF THE INVENTION

The present invention provides a method to reduce a regulated power source voltage spike during operation of an integrated circuit comprising the steps of:
- providing a voltage spike reducer enabling pulse via a pulse generator circuit responsive to a pulse generator input signal;
- translating the voltage level of an unregulated power source via a level translation circuit during the presence of the voltage spike reducer enabling pulse; and
- providing a measure of current from the unregulated power source to said regulated power source via a current driver stage that is responsive to the level translation circuit.

The method of the present is accomplished by an active pull-up voltage spike reducing circuitry comprising:
- first, second and third potentials for powering the active pull-up voltage spike reducing circuitry;
- a pulse generator stage responsive to a pulse generator input signal;
- a level translator circuit to provide a translated voltage level; and
- a current driver stage responsive to the translated voltage level to thereby provide additional current to said third potential.

DETAILED DESCRIPTION OF THE PREFERRED EMBODIMENT

Figure 1:
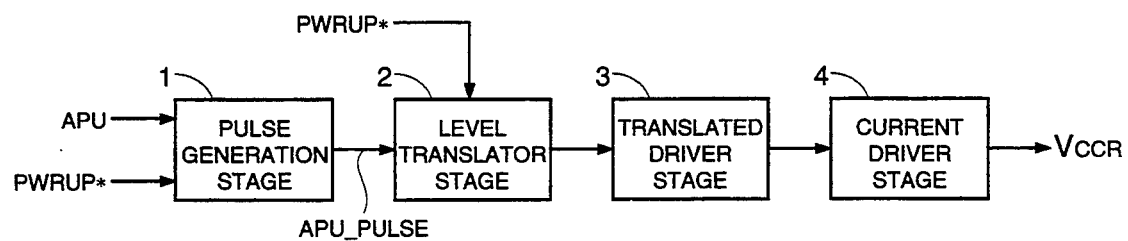
FIG. 1, gives a general block diagram representation of the present invention depicting an active pull-up voltage spike reducer.

FIG. 1, gives a general block diagram representation of the present invention depicting an active pull-up voltage spike reducer comprising, a pulse generator stage 1, a level translator stage 2, a translated driver stage 3, and a current driver stage 4.

Figure 2:
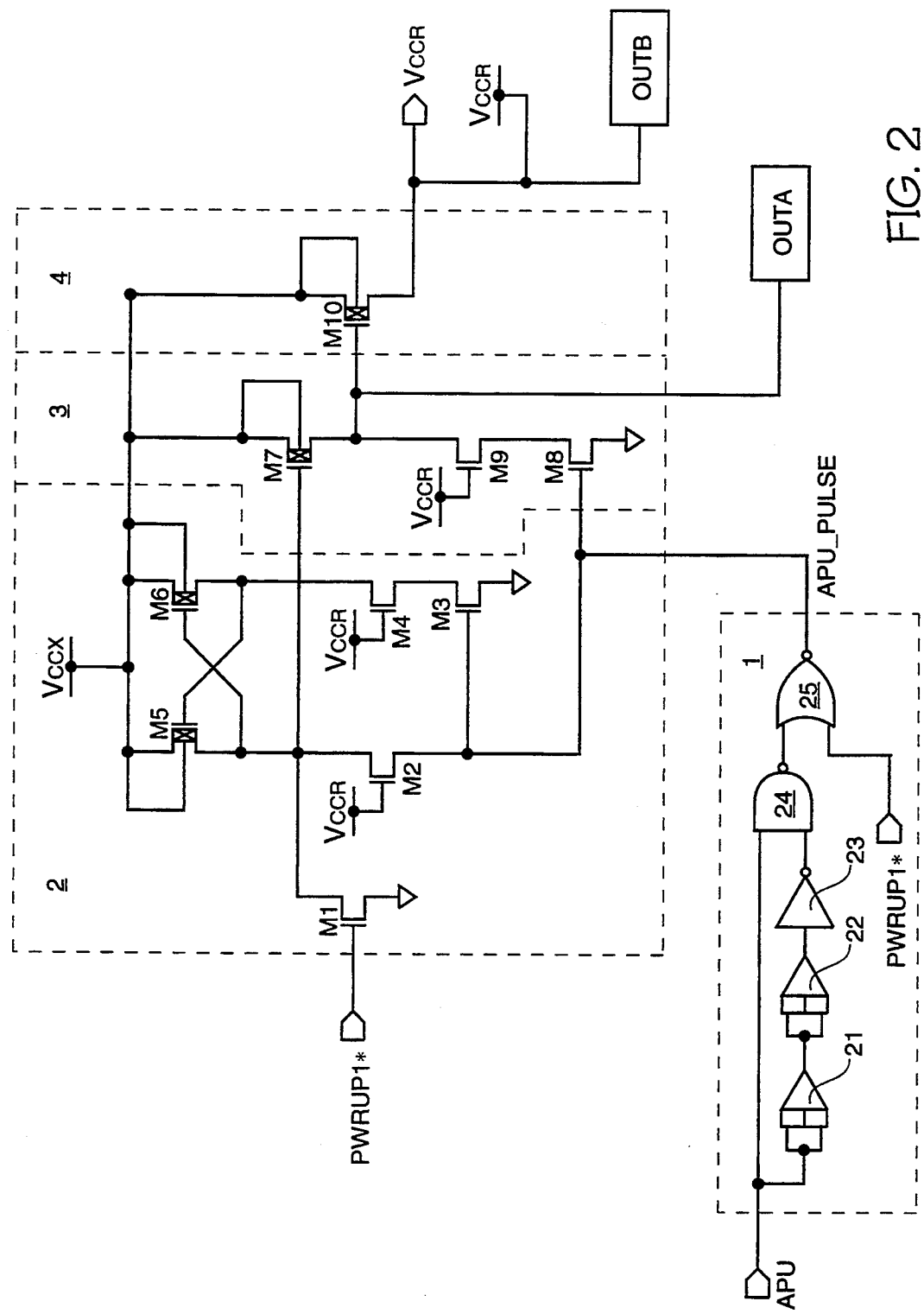
FIG. 2, gives a more detailed schematic representation of the present invention depicting the active pull-up voltage spike reducer.

FIG. 2, gives a more detailed schematic representation of the present invention depicting the active pull-up voltage spike reducer comprising, a pulse generator stage 1, a level translator stage 2, a translated driver stage 3, and a current driver stage 4.

Referring now to FIG. 2, pulse generator stage 1 comprises several resistance/capacitance networks 21 and 22 connected serially to an inverter 23. The output of inverter 23 is connected to an input of NAND gate 24. The output of NAND gate 24 is connected to an input of NOR gate 25. The output of NOR gate 25 is connected to level translator stage 2 and translated driver stage 3 and provides the spike reducer enabling pulse. A triggering signal, in this case labeled APU, is supplied to the first resistance/capacitance network 21 and a second input to NAND gate 24. A second signal, labeled PWRUP1* in this case, is supplied to a second input of NOR gate 25. NAND gate 24 provides a pulse to NOR gate 25 and NOR gate 25 provides an output pulse, APU_PULSE, to level translator stage 2 when PWRUP1* is not active.

Level translator stage 2 is made up of NMOS transistor M1 which connects to (the cross-coupled transistor pair) M5 and M6 at an output terminal of transistor M5 and to the gate of a transistor M6, a terminal of transmission gate (or pass) transistor M2 and finally to a the gate of disabling driver M7. Cross-coupled transistors M5 and M6 are a pair of PMOS transistors which are connected between an external power supply labeled $V_{CCX}$, and a first and second NMOS pass transistors M2 and M4 (always on by having their gates tied to high potential $V_{CCR}$). A series connected enabling NMOS transistor M3 is connected between M4 and a common potential (ground). Transistor M1 has its gate connected to the PWRUP1* signal. When PWRUP1* is true, M1 turns on and places ground (a low potential compared to $V_{CCX}$, or typically 0V) on the gate of M6 which in turn drives the gate of M5 high, thus turning M5 off. M1 also places a low potential on the gate of M7 which turns M7 on, thus basically placing $V_{CCX}$ on its output terminal.

Translated driver stage 3 is made up of enabling NMOS transistor M8 and a pass transistor M9 that are connected serially between the output terminal of M7 and ground. The gate of transistor M8 is connected to the gate of transistor M3 and to a second terminal of M2, all of which are connected to the output terminal of NOR gate 25. When an APU_PULSE goes true, the pulse turns on enabling transistors M3 and M8, passes through transistor M2 to disable latch transistor M6 and turns off transistor M7. During the time period that APU_PULSE is active, transistor M3 pulls the gate of transistor M5 to ground via pass transistor M4 and thus enables transistor M5. At the same time M8 is active and (via pass transistor M9) pulls the gate of a current driver transistor M10 to ground to activate M10. Once M10 becomes active, it now supplies the necessary current from external source $V_{CCX}$ to an internal regulated potential source, labeled $V_{CCR}$. This extra current is supplied only during the period of time that APU_PULSE is true. The combination of level translator stage 2 and translated driver stage 3 provide the general operation of a level translator circuit.

Figure 3:
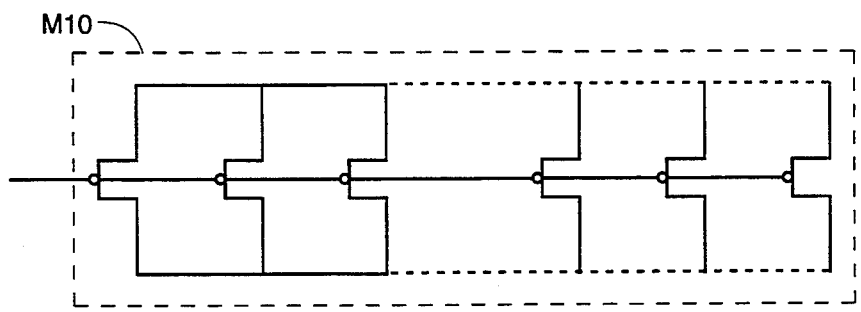
FIG. 3 depicts a preferred current drive transistor to be used in the present invention.

Referring now to FIG. 3, the current driver transistor M10 is made up of a transistor having multiple input and output terminals that may be strapped together in parallel in order to provide the needed current to reduce a voltage spike when a major current draw is required from the internal circuitry of a semiconductor device. The multiple terminals are strapped with metal once the desired transistor drive is determined.

By providing additional current to the supply of an active semiconductor device, the operating speed of the given device is maintained at the cost of consuming additional power. For example, using this circuit (or any equivalents thereof) in memory devices, such as DRAMs, during the read/write cycle, the data access time of the device is maintained as the necessary current is supplied at these critical cycles.

It is to be understood that although the present invention has been described with reference to a preferred embodiment, various modifications (such as NMOS and PMOS transistor ratios and sizing, varying circuit operating potentials or even developing a bipolar transistor version) known to those skilled in the art, may be made to the circuit presented herein without departing from the invention as recited in the several claims appended hereto.

What is claimed is:

1. An active pull-up voltage spike reducing circuit comprising:
   first, second and third potentials for powering said active pull-up voltage spike reducing circuit;
   a pulse generator producing a pulse generator output pulse that is responsive to a pulse generator input signal and an enabling signal said pulse generator stage comprises an inverting, signal delay means for delaying the pulse generator input signal and means for combining the pulse generator input signal with the delayed, inverted input signal thereby generating said pulse generator output pulse;
   a level translator stage connected between said first and second potentials, said level translator stage producing a level translator output that is responsive to said pulse generator output pulse and to said enabling signal;
   a translated driver stage connected between said first and second potentials, said translated driver stage producing a translator driver output that is responsive to said level translator output signal and said pulse generator output pulse; and
   a current driver stage connected to said first potential, said current driver stage producing a current driver output that is responsive to said translated driver output said current driver output provides additional current to said third potential.

2. A circuit as recited in claim 1, wherein said pulse generator stage further comprises an input of a resistance/capacitance network connected to a first input of a CMOS NAND gate and its output connected to an CMOS inverter, the output of said inverter connected to a second input of said CMOS NAND gate, the output of said NAND gate connected to a first input of a CMOS NOR gate.

3. An active pull-up voltage spike reducing circuit comprising:
   first, second and third potentials for powering said active pull-up voltage spike reducing circuit;
   a pulse generator stage producing a pulse generator output pulse that is responsive to a pulse generator input signal and an enabling signal;
   a level translator stage connected between said first and second potentials, said level translator stage producing a level translator output that is responsive to said pulse generator output pulse and to said enabling signal, said level translator stage comprises a pair of first and second cross-coupled transistors, a disabling transistor, first and second transmission gate transistors, and an enabling transistor;
   wherein said first cross-coupled transistor, and first transmission gate transistor are connected serially between said first potential and the pulse generator stage output, respectively, said second cross-coupled transistor, said second transmission gate transistor and said enabling transistors are connected serially between said first and second potentials, respectively, said enabling transistor being responsive to said pulse generator output pulse, each gate of said first and second transmission gate transistors being connected to said third potential;
   a translated driver stage connected between said first and second potentials, said translated driver stage producing a translator driver output that is responsive to said level translator output signal and said pulse generator output pulse; and
   a current driver stage connected to said first potential, said current driver stage producing a current driver output that is responsive to said translated driver output said current driver output provides additional current to said third potential.

4. The circuit as recited in claim 3, wherein said first and second transmission gate transistors, said disabling transistor and said enabling transistor are NMOS field effect transistors, and said cross-coupled transistor pair are PMOS field effect transistors.

5. An active pull-up voltage spike reducing circuit comprising:
   first, second and third potentials for powering said active pull-up voltage spike reducing circuit;
   a pulse generator stage producing a pulse generator output pulse that is responsive to a pulse generator input signal and an enabling signal;
   a level translator stage connected between said first and second potentials, said level translator stage producing a level translator output that is responsive to said pulse generator output pulse and to said enabling signal;
   a translated driver stage connected between said first and second potentials, said translated driver stage producing a translator driver output that is responsive to said level translator output signal and said pulse generator output pulse, said translated driver stage comprising a disabling transistor, a transmission gate transistor, and an enabling transistor;

wherein said disabling transistor, said transmission gate transistor and said enabling transistor are connected serially between said first potential and said second potential, respectively, the gate of said disabling transistor being responsive to said level translator output, the gate of said transmission gate transistor being connected to said third potential and the gate of said enabling transistor being responsive to the pulse generator stage output pulse; and a current driver stage connected to said first potential, said current driver stage producing a current driver output that is responsive to said translated driver output said current driver output provides additional current to said third potential.

6. The circuit as recited in claim 5, wherein said transmission gate transistor and said enabling transistor are NMOS field effect transistors and said disabling transistor is a PMOS field effect transistor.

7. An active pull-up voltage spike reducing circuit comprising:
first, second and third potentials for powering said active pull-up voltage spike reducing circuit;
a pulse generator stage producing a pulse generator output pulse that is responsive to a pulse generator input signal and an enabling signal;
a level translator stage connected between said first and second potentials, said level translator stage producing a level translator output that is responsive to said pulse generator output pulse and to said enabling signal;
a translated driver stage connected between said first and second potentials, said translated driver stage producing a translator driver output that is responsive to said level translator output signal and said pulse generator output pulse; and
a current driver stage connected to said first potential, said current driver stage producing a current driver output that is responsive to said translated driver output said current driver output provides additional current to said third potential, said current driver stage comprises a plurality of field effect transistors coupled together in parallel to provide sufficient current to said third potential.

8. The circuit as recited in claim 7, wherein said plurality of field effect transistors are PMOS transistors.

9. A CMOS active pull-up voltage spike reducing circuit for a semiconductor device comprising:
first, second and third potentials for powering said active pull-up voltage spike reducing circuit;
a pulse generator stage producing a pulse generator output pulse that is responsive to a pulse generator input signal and an enabling signal said pulse generator stage comprises an inverting, signal delay means for delaying the pulse generator input signal and means for combining the pulse generator input signal with the delayed, inverted input signal thereby generating said pulse generator output pulse;
a level translator stage connected between said first and second potentials, said level translator stage producing a level translator output that is responsive to said pulse generator output pulse and to said enabling signal;
a translated driver stage connected between said first and second potentials, said translated driver stage producing a translator driver output that is responsive to said level translator output signal and said pulse generator output pulse; and a current driver stage connected to said first potential, said current driver stage producing a current driver output that is responsive to said translated driver output said current driver output provides additional current to said third potential.

10. A circuit as recited in claim 9, wherein said pulse generator stage further comprises an input of a resistance/capacitance network connected to a first input of a CMOS NAND gate and its output connected to an CMOS inverter, the output of said inverter connected to a second input of said CMOS NAND gate, the output of said NAND gate connected to a first input of a CMOS NOR gate.

11. A CMOS active pull-up voltage spike reducing circuit for a semiconductor device comprising:
first, second and third potentials for powering said active pull-up voltage spike reducing circuit;
a pulse generator stage producing a pulse generator output pulse that is responsive to a pulse generator input signal and an enabling signal;
a level translator stage connected between said first and second potentials, said level translator stage producing a level translator output that is responsive to said pulse generator output pulse and to said enabling signal, said level translator stage comprises a pair of first and second cross-coupled transistors, a disabling transistor, first and second transmission gate transistors, and an enabling transistor;
wherein said first cross-coupled transistor, and first transmission gate transistor are connected serially between said first potential and the pulse generator stage output, respectively, said second cross-coupled transistor, said second transmission gate transistor and said enabling transistors are connected serially between said first and second potentials, respectively, said enabling transistor being responsive to said pulse generator output pulse, each gate of said first and second transmission gate transistors being connected to said third potential;
a translated driver stage connected between said first and second potentials, said translated driver stage producing a translator driver output that is responsive to said level translator output signal and said pulse generator output pulse; and
a current driver stage connected to said first potential, said current driver stage producing a current driver output that is responsive to said translated driver output said current driver output provides additional current to said third potential.

12. The circuit as recited in claim 11, wherein said first and second transmission gate transistors, said disabling transistor and said enabling transistor are NMOS field effect transistors, and said cross-coupled transistor pair are PMOS field effect transistors.

13. A CMOS active pull-up voltage spike reducing circuit for a semiconductor device comprising:
first, second and third potentials for powering said active pull-up voltage spike reducing circuit;
a pulse generator stage producing a pulse generator output pulse that is responsive to a pulse generator input signal and an enabling signal;
a level translator stage connected between said first and second potentials, said level translator stage producing a level translator output that is responsive to said pulse generator output pulse and to said enabling signal;

a translated driver stage connected between said first and second potentials, said translated drive stage producing a translator driver output that is responsive to said level translator output signal and said pulse generator output pulse, said translated driver stage comprising a disabling transistor, a transmission gate transistor, and an enabling transistor;

wherein said disabling transistor, said transmission gate transistor and said enabling transistor are connected serially between said first potential and said second potential, respectively, the gate of said disabling transistor being responsive to said level translator output, the gate of said transmission gate transistor being connected to said third potential and the gate of said enabling transistor being responsive to the pulse generator stage output pulse; and a current driver stage connected to said first potential, said current driver stage producing a current driver output that is responsive to said translated driver output said current driver output provides additional current to said third potential.

14. The circuit as recited in claim 13, wherein said transmission gate transistor and said enabling transistor are NMOS field effect transistors and said disabling transistor is a PMOS field effect transistor.

15. A CMOS active pull-up voltage spike reducing circuit for a semiconductor device comprising:

first, second and third potentials for powering said active pull-up voltage spike reducing circuit;

a pulse generator stage producing a pulse generator output pulse that is responsive to a pulse generator input signal and an enabling signal;

a level translator stage connected between said first and second potentials, said level translator stage producing a level translator output that is responsive to said pulse generator output pulse and to said enabling signal;

a translated driver stage connected between said first and second potentials, said translated driver stage producing a translator driver output that is responsive to said level translator output signal and said pulse generator output pulse; and a current driver stage connected to said first potential, said current driver stage producing a current driver output that is responsive to said translated driver output said current driver output provides additional current to said third potential, said current driver stage comprises a plurality of field effect transistors coupled together in parallel to provide sufficient current to said third potential.

16. The circuit as recited in claim 15, wherein said plurality of field effect transistors are PMOS transistors.

* * * * *